United States Patent
Chiu

(10) Patent No.: US 8,587,089 B2
(45) Date of Patent: Nov. 19, 2013

(54) SEAL RING STRUCTURE WITH POLYIMIDE LAYER ADHESION

(75) Inventor: Tzu-Wei Chiu, Hsin Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 348 days.

(21) Appl. No.: 12/938,680

(22) Filed: Nov. 3, 2010

(65) Prior Publication Data

US 2012/0104541 A1     May 3, 2012

(51) Int. Cl.
*H01L 23/52*     (2006.01)

(52) U.S. Cl.
USPC ............ 257/620; 257/758; 257/E23.002; 438/106; 438/462; 438/622

(58) Field of Classification Search
USPC .......... 257/730, 773, E23.114, 620, 758, 257/E23.002; 438/424, 106, 462, 622
See application file for complete search history.

(56) References Cited

U.S. PATENT DOCUMENTS

| | | | |
|---|---|---|---|
| 6,537,849 B1 * | 3/2003 | Tsai et al. | 438/106 |
| 6,998,712 B2 * | 2/2006 | Okada et al. | 257/758 |
| 7,224,060 B2 * | 5/2007 | Zhang et al. | 257/730 |
| 2006/0012012 A1 * | 1/2006 | Wang et al. | 257/620 |
| 2010/0078769 A1 * | 4/2010 | West et al. | 257/620 |

* cited by examiner

*Primary Examiner* — John C Ingham
(74) *Attorney, Agent, or Firm* — Haynes and Boone, LLP

(57) ABSTRACT

The present disclosure provides a semiconductor device, including a substrate having a seal ring region and a circuit region, a seal ring structure disposed over the seal ring region, a first passivation layer disposed over the seal ring structure, the first passivation layer having a first passivation layer aperture over the seal ring structure, and a metal pad disposed over the first passivation layer, the metal pad coupled to the seal ring structure through the first passivation layer aperture and having a metal pad aperture above the first passivation layer aperture. The device further includes a second passivation layer disposed over the metal pad, the second passivation layer having a second passivation layer aperture above the metal pad aperture, and a polyimide layer disposed over the second passivation layer, the polyimide layer filling the second passivation layer aperture to form a polyimide root at an exterior tapered edge of the polyimide layer.

20 Claims, 13 Drawing Sheets

SEAL RING STRUCTURE WITH POLYIMIDE LAYER ADHESION

BACKGROUND

In the design and packaging of semiconductor integrated circuits (ICs), there are several areas of concern. Moisture needs to be prevented from entering the circuits because: (1) moisture can be trapped in oxides and increase the dielectric constant thereof; (2) moisture can create trapped charge centers in gate oxides causing threshold voltage shifts in complementary metal-oxide-semiconductor (CMOS) transistors; (3) moisture can create interface states at the Si-gate oxide interface causing degradation in the transistor lifetime through increased hot-electron susceptibility; (4) moisture can cause corrosion of the metal interconnect, reducing the reliability of the IC; and (5) when trapped in Si-oxide, moisture can reduce the oxide mechanical strength and the oxide may become more prone to cracking due to tensile stress. Ionic contaminants can also cause damage to the IC as they can diffuse rapidly in silicon oxide. For instance, ionic contaminants can cause threshold voltage instability in CMOS transistors and alter the surface potential of the Si surface in the vicinity of the ionic contaminants. Dicing processes that separate adjacent IC dies from one another may cause potential damage to the IC. Furthermore, subsequent wet etch and/or curing processes can cause layer peeling.

A seal ring has been used in the industry to protect the IC from moisture degradation, ionic contamination, and dicing processes, but improvement has been desirable. In particular, subsequent wet etch and curing processes may cause peeling of a polyimide layer over the seal ring resulting from stress inducement and chemical attack (e.g., dilute HF) at the polyimide layer interface. Accordingly, improved methods of semiconductor device fabrication and devices fabricated by such methods are desired.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over, above, or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Figure 1:
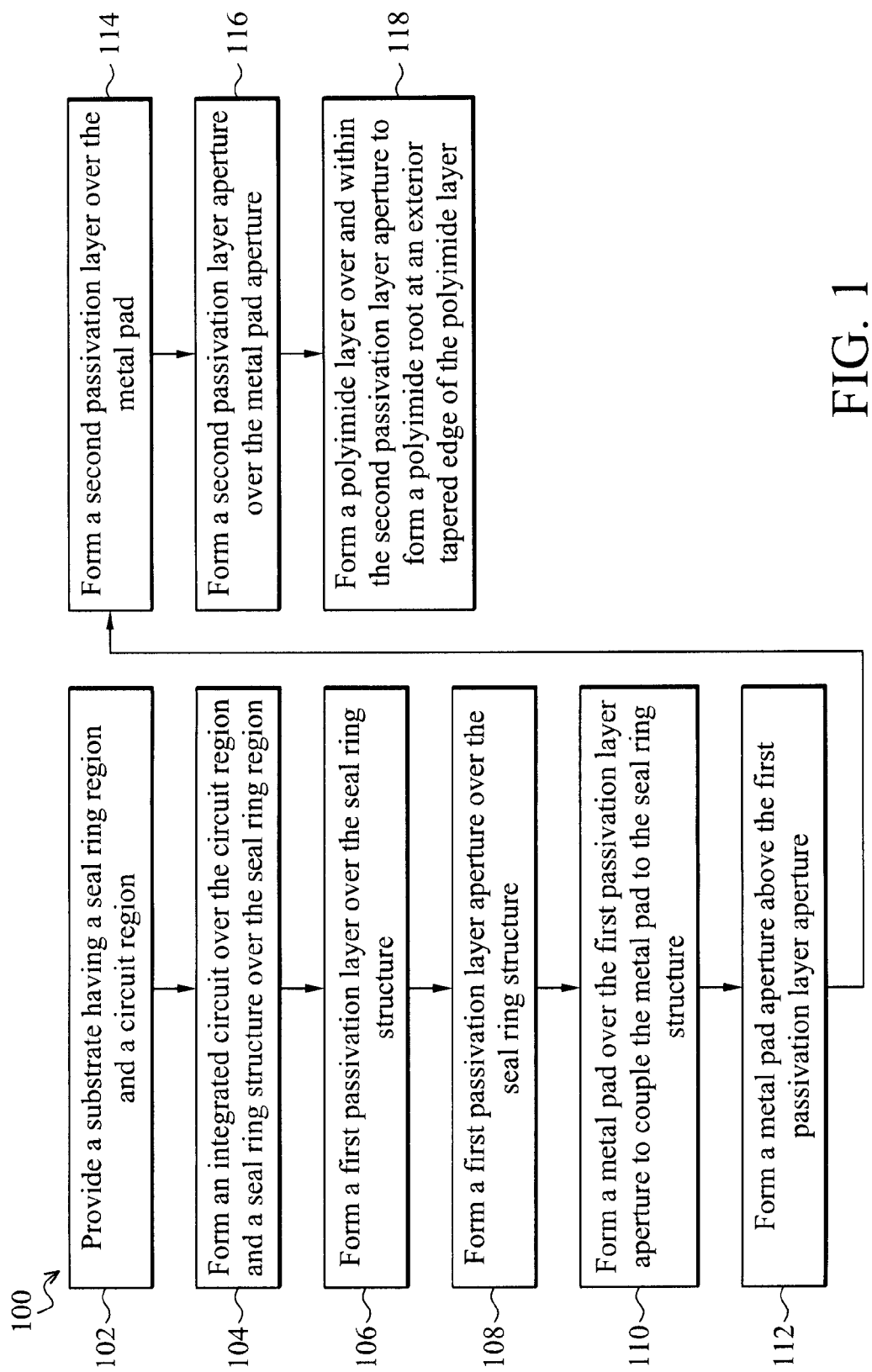
FIG. 1 is a flowchart illustrating a method for fabricating a semiconductor device with a seal ring structure having a polyimide layer root for preventing polyimide layer peeling according to various aspects of the present disclosure.
Figure 2:
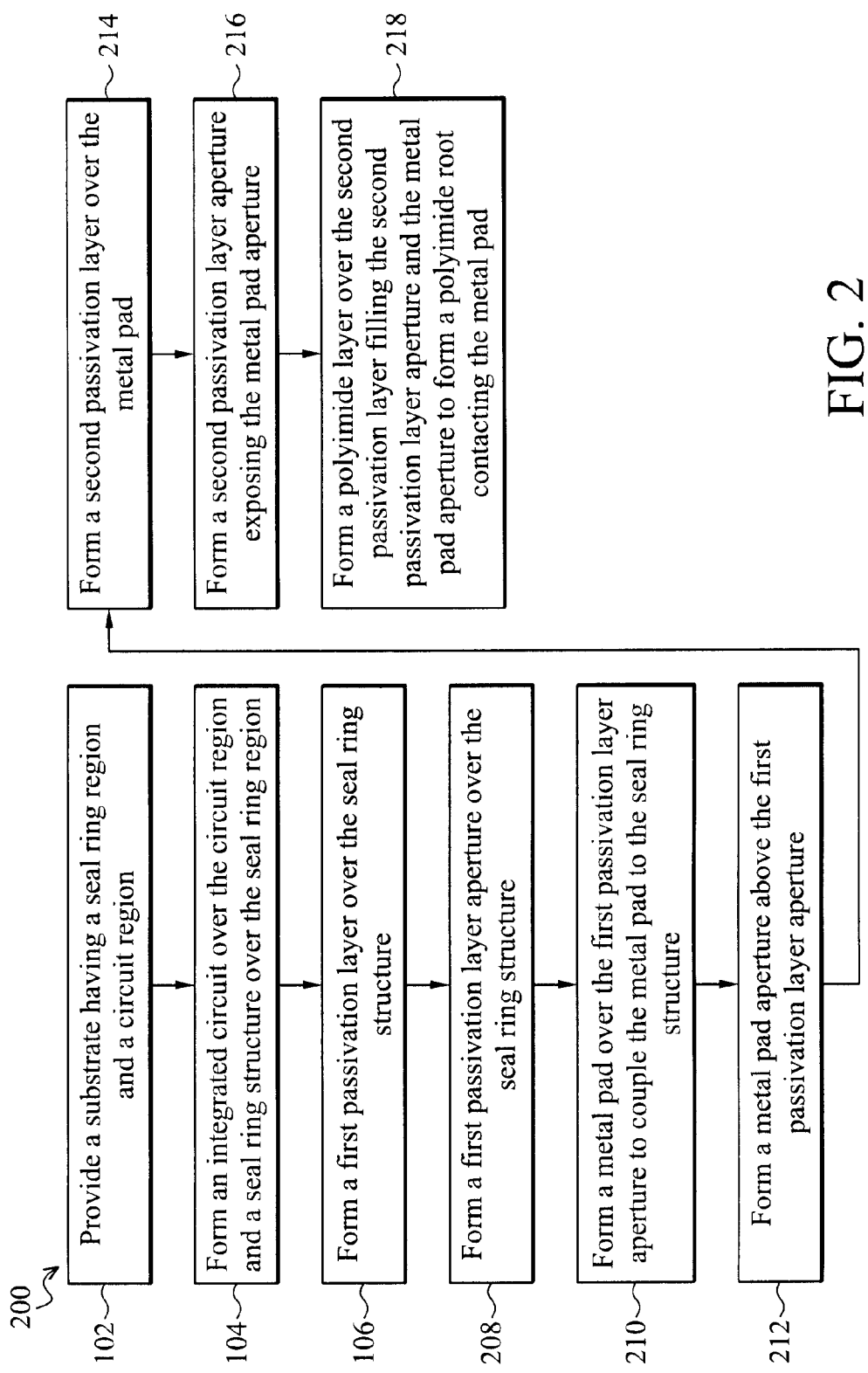
FIG. 2 is a flowchart illustrating another method for fabricating a semiconductor device with a seal ring structure having a polyimide layer root for preventing polyimide layer peeling according to various aspects of the present disclosure.
Figure 3:
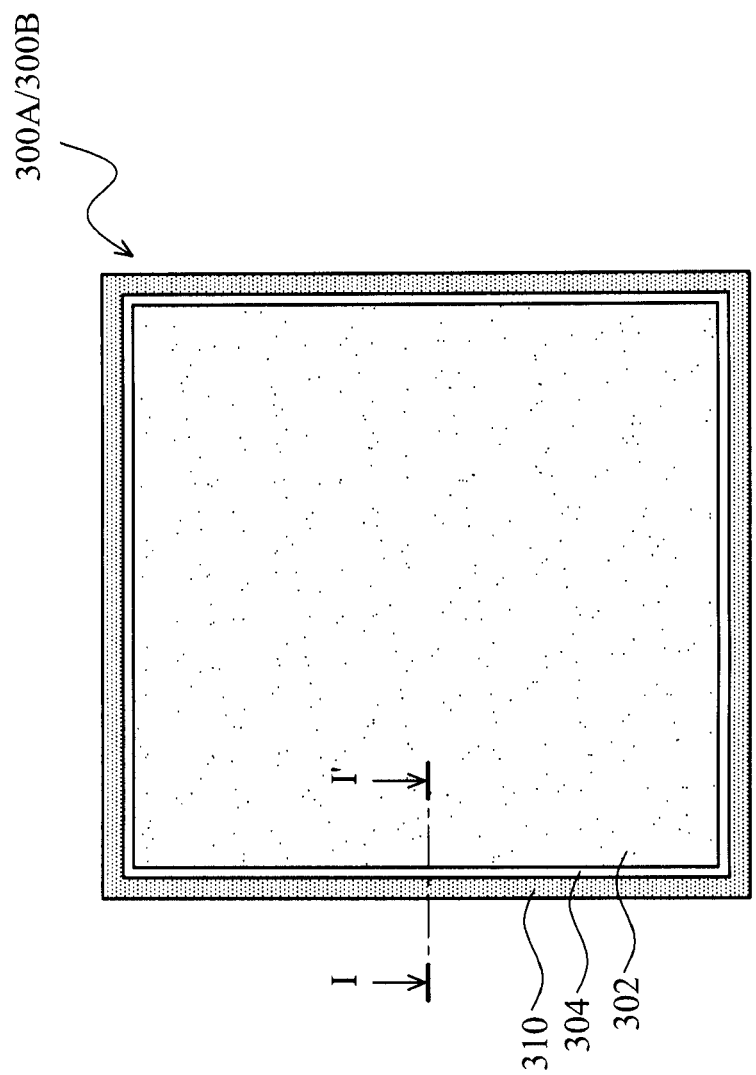
FIG. 3 is a top plan view of an integrated circuit (IC) die with a seal ring structure according to various aspects of the present disclosure.
Figure 4:
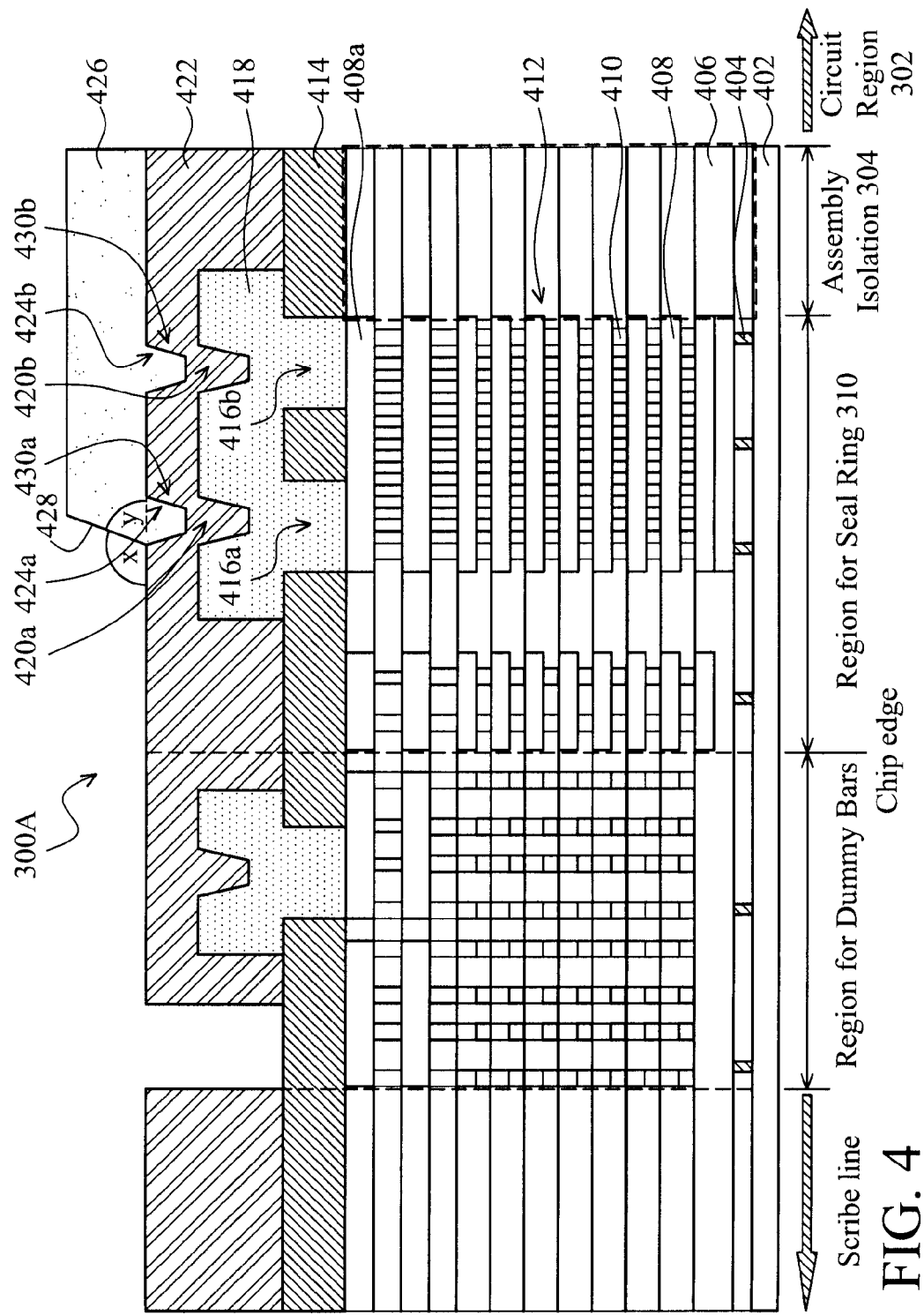
FIGS. 4 and 5 are cross-sectional views along line I-I' in FIG. 3 of alternative seal ring sections according to various aspects of the present disclosure.
Figure 5:
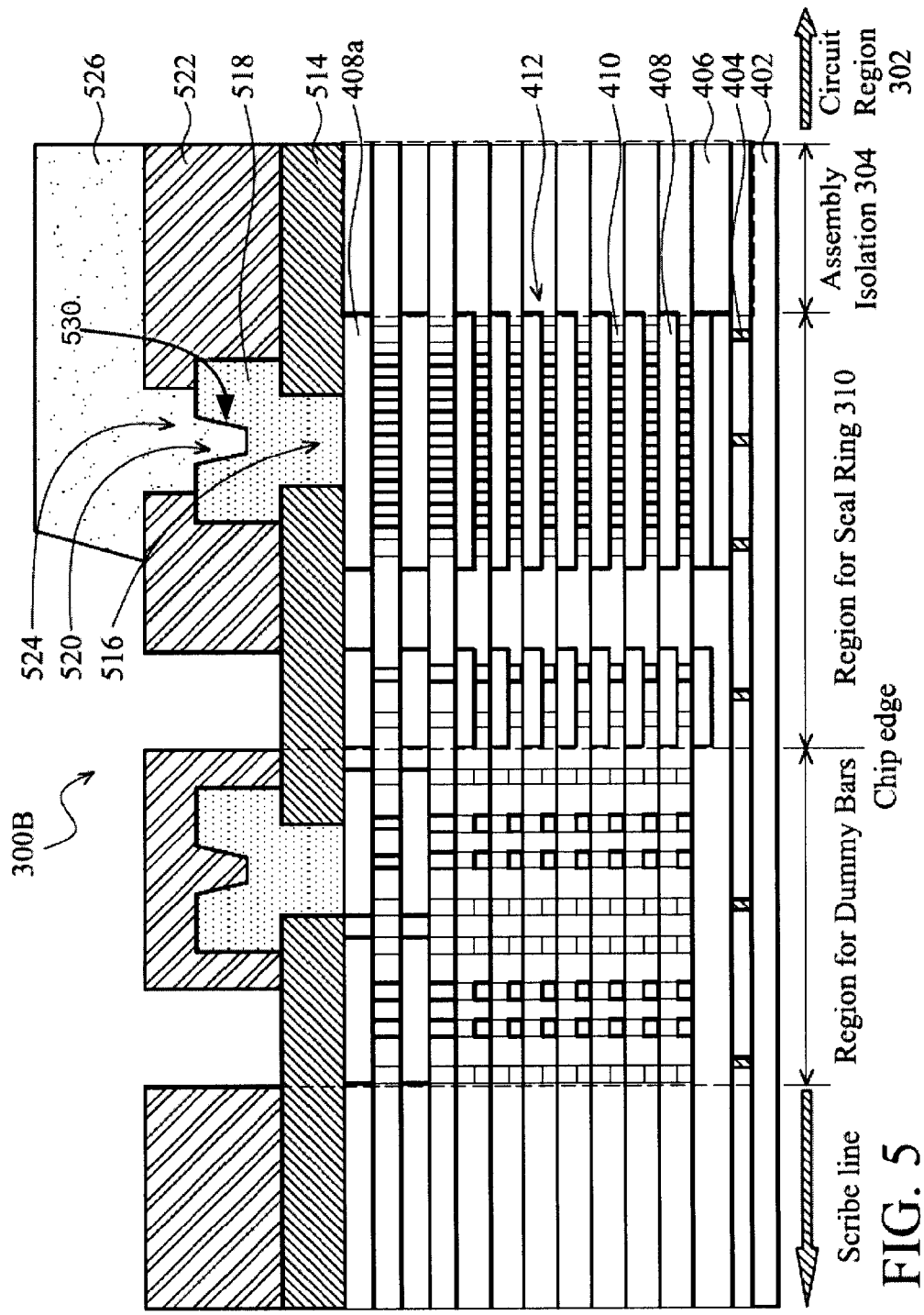

Referring to the figures, FIG. 1 illustrates a flowchart of a method 100 for fabricating a semiconductor device with a seal ring structure having a polyimide layer root for substantially preventing polyimide layer peeling from subsequent wet etch and/or curing processes according to various aspects of the present disclosure. FIG. 2 is a flowchart illustrating a method 200 for fabricating another semiconductor device with a seal ring structure having a polyimide layer root for preventing polyimide layer peeling according to various aspects of the present disclosure. FIG. 3 is a top plan view of semiconductor devices 300A or 300B including an integrated circuit (IC) die and a seal ring structure around the IC die according to various aspects of the present disclosure. FIGS. 4 and 5 are cross-sectional views along line I-I' in FIG. 3 of alternative seal ring sections according to various aspects of the present disclosure. FIGS. 6A-6D are cross-sectional views of the semiconductor device of FIG. 4 at various stages of fabrication according to an embodiment of the present disclosure. FIGS. 7A-7D are cross-sectional views of the semiconductor device of FIG. 5 at various stages of fabrication according to another embodiment of the present disclosure.

It is noted that similar features may be similarly numbered for the sake of simplicity and clarity. It is further noted that part of the semiconductor device 300A/300B may be fabricated with a CMOS process flow. Accordingly, it is understood that additional processes may be provided before, during, and after the method 100 of FIG. 1 and/or the method 200 of FIG. 2, and that some other processes may only be briefly described herein. The semiconductor device 300A/300B may be fabricated to include a backside illuminated (BSI) device having an interlayer dielectric (ILD) such as a low-k intermetal dielectric (IMD) in another example.

Referring now to FIG. 1, method 100 begins with block 102 in which a semiconductor substrate is provided having a seal ring region and a circuit region. In an embodiment, the seal ring region is formed around the circuit region, and the seal ring region is for forming a seal ring structure thereon and the circuit region is for at least forming a transistor device therein. The method 100 continues with block 104 in which an integrated circuit is formed over the circuit region and a seal ring structure is formed over the seal ring region. The method 100 continues with block 106 in which a first passivation layer is formed over the seal ring structure in the seal ring region, and with block 108 in which a first passivation layer aperture is etched in the first passivation layer over the seal ring structure. In one embodiment, the first passivation layer aperture is adjacent to an exterior side of the seal ring structure. The method continues with block 110 in which a metal pad is formed over the first passivation layer aperture to couple the metal pad to the seal ring structure, and at block 112, a metal pad aperture is formed above the first passivation layer aperture. At block 114, a second passivation layer is formed over the metal pad, and at block 116 a second passivation layer aperture is formed in the second passivation layer over the metal pad aperture. At block 118, a polyimide layer is formed over and within the second passivation layer aperture to form a polyimide root at an exterior tapered edge of the polyimide layer. Other layers, lines, vias, and structures may also be provided before, during, or after the steps of method 100. In one example, backside processing may take place. Advantageously, because the polyimide layer root is formed in accordance with the present disclosure, peeling of the polyimide layer from subsequent wet etch and/or curing processes may be substantially prevented.

Referring now to FIG. 2, method 200 begins with block 102 and continues with blocks 104 and 106 in substantially the same steps as in method 100 of FIG. 1. At block 102, a semiconductor substrate is provided having a seal ring region and a circuit region. In an embodiment, the seal ring region is formed around the circuit region, and the seal ring region is for forming a seal ring structure thereon and the circuit region is for at least forming a transistor device therein. At block 104, an integrated circuit is formed over the circuit region and a seal ring structure is formed over the seal ring region, and at block 106 a first passivation layer is formed over the seal ring structure in the seal ring region. At block 208, a first passivation layer aperture is formed over the seal ring structure, but in this embodiment, the first passivation layer aperture is set apart from an exterior side of the seal ring structure. At step 210, a metal pad is formed over the first passivation layer aperture to couple the metal pad to the seal ring structure, and at step 212, a metal pad aperture is formed above the first passivation layer aperture. At step 214, a second passivation layer is formed over the metal pad, and at step 216 a second passivation layer aperture is formed exposing the metal pad aperture. At step 218, a polyimide layer is formed over the second passivation layer filling the second passivation layer aperture and the metal pad aperture to form a polyimide root contacting the metal pad. Advantageously, because the polyimide layer root is formed in accordance with the present disclosure, peeling of the polyimide layer from subsequent wet etch and/or curing processes may be substantially prevented.

Referring now to FIG. 3, a top plan view of a device 300A or 300B is illustrated including an integrated circuit (IC) die 302, a seal ring structure 310 around the IC die 302, and an assembly isolation region 304 therebetween according to various aspects of the present disclosure. Alternative cross-sectional views of the seal ring region along line I-I' are illustrated in FIGS. 4 and 5 according to embodiments of the present disclosure.

Referring now to FIG. 4 in conjunction with FIGS. 1 and 3, a cross-sectional view is illustrated of an embodiment of semiconductor device 300A at a stage of fabrication according to the method 100 of FIG. 1. The semiconductor device 300A may include a semiconductor substrate 402 such as a silicon substrate (e.g., a p-doped substrate) having a seal ring region 310 and assembly isolation region 304 surrounding IC die 302 in a circuit region. In an embodiment, the seal ring region 310 is formed around the circuit region, and the seal ring region is for forming a seal ring structure thereon and the circuit region is for forming at least a transistor device therein. The substrate 402 may alternatively include silicon germanium, gallium arsenic, or other suitable semiconductor materials. The substrate 402 may further include doped regions, such as a P-well, an N-well, and/or a doped active region such as a P+ doped active region. In one aspect, the doped active regions may be disposed within other regions. The substrate 402 may further include other features such as a buried layer, and/or an epitaxy layer. Furthermore, the substrate 402 may be a semiconductor on insulator such as silicon on insulator (SOI). In other embodiments, the semiconductor substrate 402 may include a doped epitaxy layer, a gradient semiconductor layer, and/or may further include a semiconductor layer overlying another semiconductor layer of a different type such as a silicon layer on a silicon germanium layer. In other examples, a compound semiconductor substrate may include a multilayer silicon structure or a silicon substrate may include a multilayer compound semiconductor structure.

The device 300A may further include isolation structures, such as shallow trench isolation (STI) features or LOCOS features formed in the substrate 402 for isolating active regions from other regions of the substrate. The active regions may be configured as an NMOS device (e.g., nFET) or as a PMOS device (e.g., pFET) in one example.

The device 300A may further include dummy gate and/or gate structures (not shown) overlying the substrate 402, which may be formed from various material layers and by various etching/patterning techniques over various regions of device 300A.

The device 300A further includes contact bars 404 to electrically couple active regions to the subsequently formed seal ring structure 412. It is noted that other layers may be provided in the seal ring region to form various features over and/or under the seal ring structure such as passivation layers, nitride layers, and polyimide layers deposited by CVD, spin-on techniques, or the like.

The semiconductor substrate 402 may further include underlying layers, overlying layers, devices, junctions, and other features formed during prior process steps or which may be formed during subsequent process steps, such as with backside processing.

Device 300A includes seal ring structure 412 disposed over substrate 402 in the seal ring region 310. Seal ring structure 412 may be comprised of various stacked conductive layers 408 and via layers 410 disposed through dielectric layers 406. Seal ring structure 412 may have a width between about 5 microns and about 15 microns in one example. Seal ring structure 412 is further comprised of an exterior portion or side adjacent to the chip edge and scribe line and an interior portion or side adjacent to the assembly isolation 304 and the circuit region.

Device 300A further includes a first passivation layer 414 disposed over the seal ring structure 412. In one example, the first passivation layer 414 may be deposited by a high aspect ratio process (HARP) and/or a high density plasma (HDP) CVD process. Other deposition techniques may be used. In one example, the first passivation layer 414 includes a dielectric and is one of a silicon oxide or silicon nitride. The first passivation layer 414 includes two first passivation layer apertures 416a, 416b over the seal ring structure 412. First passivation layer aperture 416a is at an exterior side of seal ring structure 412 closer to the chip edge and scribe line, and first passivation layer aperture 416b is at an interior side of seal ring structure 412 closer to the assembly isolation and circuit region. Various patterning and etching techniques and processes may be used to form the first passivation layer apertures 416a, 416b.

Device 300A further includes a metal pad 418 disposed over the first passivation layer 414 filling the first passivation layer apertures 416a, 416b to couple metal pad 418 to seal ring structure 412, and in one example the metal pad 418 is coupled to a top metal layer 408a of seal ring structure 412. In one example, metal pad 418 may be comprised of aluminum and the metal layers of the seal ring structure may be comprised of copper. Other metals are applicable and may be used. Metal pad 418 includes metal pad apertures 420a and 420b above first passivation layer apertures 416a and 416b, respectively.

Device 300A further includes a second passivation layer 422 disposed over seal ring structure 412, first passivation layer 414, and metal pad 418. Second passivation layer 422 includes second passivation layer apertures 424a and 424b above metal pad apertures 420a and 430b and first passivation layer apertures 416a and 416b, respectively. In one example, the second passivation layer 422 includes a dielectric and is one of a silicon nitride or silicon oxide. In yet another example, the first passivation layer 414 is formed of silicon oxide or silicon nitride and the second passivation layer 422 is formed of silicon nitride or silicon oxide, respectively. In yet another example, the first passivation layer 414 and the second passivation layer 422 may be comprised of the same material.

Device 300A further includes a polyimide layer 426 disposed over the seal ring structure 412 and second passivation layer 422 filling the second passivation layer apertures 424a and 424b to form polyimide roots 430a and 430b. Polyimide layer 426 includes an exterior tapered edge 428 having, in one example, an angle from horizontal "y" between about 70 degrees and about 75 degrees and a complementary angle from horizontal "x" between about 105 degrees and about 110 degrees. In one embodiment, exterior tapered edge 428 of polyimide layer 426 is tapered at an angle moving vertically away from the chip edge or scribe line and toward the assembly isolation or circuit region. Polyimide root 430a is disposed at the exterior tapered edge 428 of the polyimide layer 426. Advantageously, polyimide shrink forces and/or peeling effects are reduced with a greater vertical angle of the exterior edge of the polyimide layer. Polyimide layer 426 further has a thickness from second passivation layer 422 ranging between about 5 micron and about 10 micron in one example. Advantageously, polyimide shrink forces and/or peeling effects are reduced with reduced thickness of the polyimide layer. Furthermore, a plurality of polyimide roots at the interface between polyimide layer 426 and second passivation layer 422 improves adhesion of the polyimide layer to second passivation layer 422 and reduces peeling effects.

The various passivation layers, metal pads, and polyimide layer may undergo patterning and etch steps to form the structure profiles as desired. As note above, device 300A may undergo further processing to form various features such as contacts/vias, interconnect metal layers, interlayer dielectric, passivation layers, backside processing, etc. to form semiconductor circuits as is known in the art.

Referring now to FIG. 5 in conjunction with FIGS. 2 and 3, a cross-sectional view is illustrated of an embodiment of semiconductor device 300B at a stage of fabrication according to the method 200 of FIG. 2. Some of the structures may be substantially similar to the embodiment disclosed in FIG. 4 and the descriptions of common structures are not repeated here although fully applicable in this embodiment as well.

In this embodiment, the semiconductor device 300B include semiconductor substrate 402 having a seal ring region 310 and assembly isolation region 304 surrounding IC die 302 in a circuit region. In an embodiment, the seal ring region 310 is formed around the circuit region, and the seal ring region is for forming a seal ring structure thereon and the circuit region is for forming at least a transistor device therein.

Device 300B includes seal ring structure 412 disposed over substrate 402 in the seal ring region 310. Seal ring structure 412 may be comprised of various stacked conductive layers 408 and via layers 410 disposed through dielectric layers 406, and may have a width between about 5 microns and about 15 microns in one example. Seal ring structure 412 is further comprised of an exterior portion or side adjacent the chip edge and scribe line and an interior portion or side adjacent the assembly isolation 304 and the circuit region.

Device 300B further includes a first passivation layer 514 disposed over the seal ring structure 412. In one example, the first passivation layer 514 may be deposited by a high aspect ratio process (HARP) and/or a high density plasma (HDP) CVD process. In one example, the first passivation layer 514 includes a dielectric and is one of a silicon oxide or silicon nitride. The first passivation layer 514 includes a first passivation layer aperture 516 formed over the seal ring structure 412. In this embodiment, first passivation layer aperture 516 is centrally disposed over seal ring structure 412.

Device 300B further includes a metal pad 518 over the first passivation layer 514 filling the first passivation layer aperture 516 to couple metal pad 518 to seal ring structure 412, and in one example the metal pad 518 is coupled to a top metal layer 408a of seal ring structure 412. In one example, metal pad 518 may be comprised of aluminum and the metal layers of the seal ring structure may be comprised of copper. Other metals may be applicable. Metal pad 518 includes a metal pad aperture 520 above first passivation layer aperture 516.

Device 300B further includes a second passivation layer 522 disposed over seal ring structure 412, first passivation layer 514, and metal pad 518. Second passivation layer 522 includes a second passivation layer aperture 524 above metal pad aperture 520 and first passivation layer aperture 516. In this embodiment, second passivation layer aperture 524 exposes the metal pad and metal pad aperture 520. In one example, the second passivation layer 522 includes a dielectric and is one of a silicon nitride or silicon oxide. In yet another example, the first passivation layer 514 is formed of silicon oxide or silicon nitride and the second passivation layer 522 is formed of silicon nitride or silicon oxide, respectively. In yet another example, the first passivation layer 514 and the second passivation layer 522 may be comprised of the same material.

Device 300B further includes a polyimide layer 526 over the seal ring structure 412 and second passivation layer 522 filling the second passivation layer aperture 524 and metal pad aperture 520 to form a polyimide root 530 that contacts the metal pad 518. Advantageously, such a polyimide root that contacts the metal pad improves adhesion of the polyimide layer to the second passivation layer and reduces peeling effects.

The various passivation layers, metal pads, and polyimide layer may undergo patterning and etch steps to form the structure profiles as desired. As note above, device 300B may undergo further processing to form various features such as contacts/vias, interconnect metal layers, interlayer dielectric, passivation layers, backside processing, etc. to form semiconductor circuits as is known in the art.

Advantageously, the polyimide layer roots formed in accordance with the present disclosure as described above substantially prevents peeling of the polyimide layer from subsequent wet etch and/or curing processes. Furthermore, the metal pads formed in accordance with the present disclosure as described above may substantially prevent die saw peeling effects and thereby protect the interior circuit device from layer peeling.

Referring now to FIGS. 6A-6D in conjunction with FIGS. 1 and 3, cross-sectional views are illustrated of the semiconductor device 300A of FIG. 4 at various stages of fabrication according to embodiments of the present disclosure.

Figure 6A:
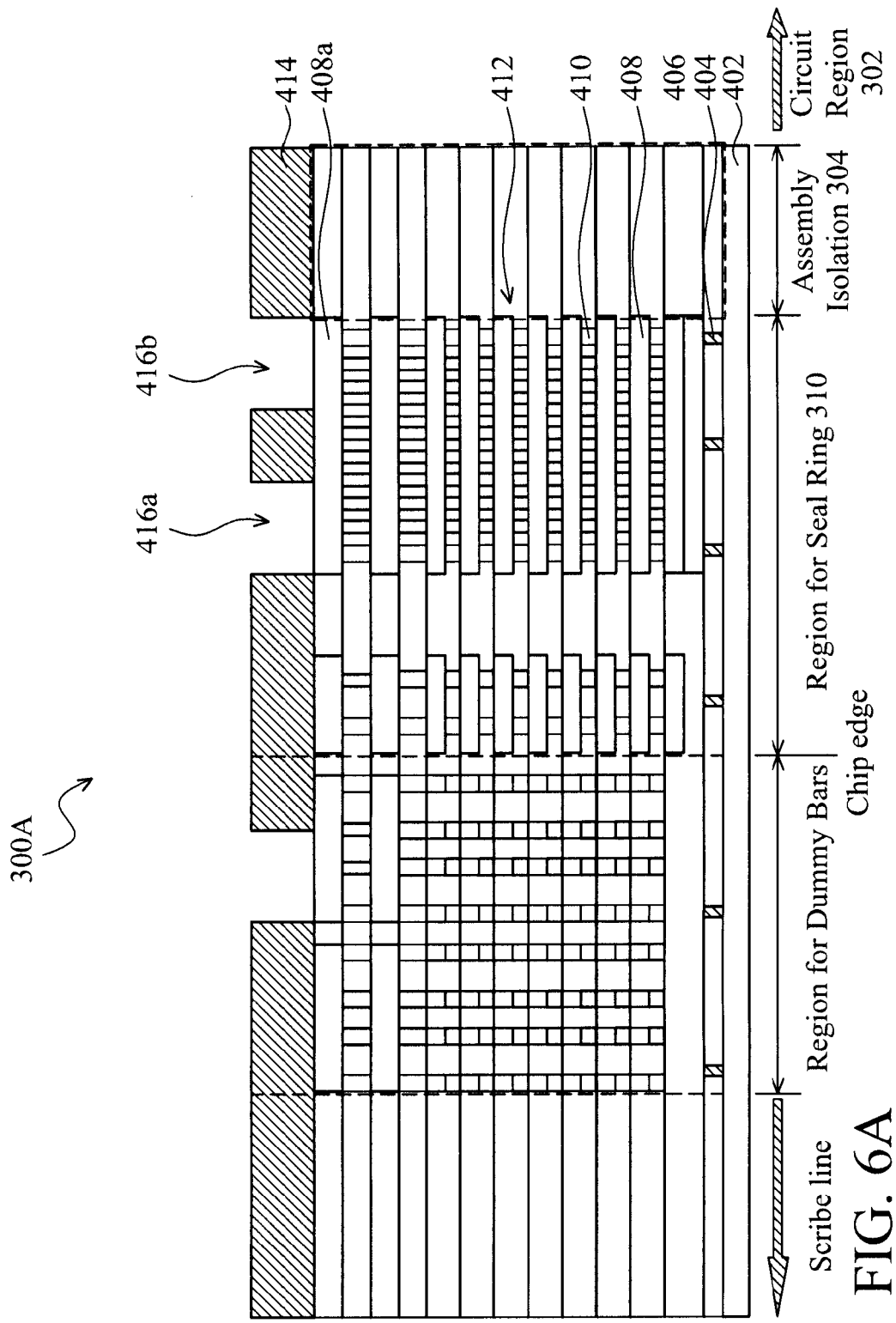
FIGS. 6A-6D are cross-sectional views of the semiconductor device of FIG. 4 at various stages of fabrication according to an embodiment of the present disclosure.

FIG. 6A illustrates the forming of a substrate 402, a seal ring structure 412 over the seal ring region, and a first passivation layer 414 over the seal ring structure 412. In one example, the first passivation layer 414 may be deposited by a high aspect ratio process (HARP) and/or a high density plasma (HDP) CVD process. Other applicable processes may be used. In one example, the first passivation layer 414 includes a dielectric and is one of a silicon oxide or silicon nitride. The first passivation layer 414 includes two first passivation layer apertures 416a, 416b formed over the seal ring structure 412. First passivation layer aperture 416a is formed at an exterior side of seal ring structure 412 and first passivation layer aperture 416b is formed at an interior side of seal ring structure 412. Apertures 416a and 416b may be formed by various applicable patterning and etching techniques.

Figure 6B:
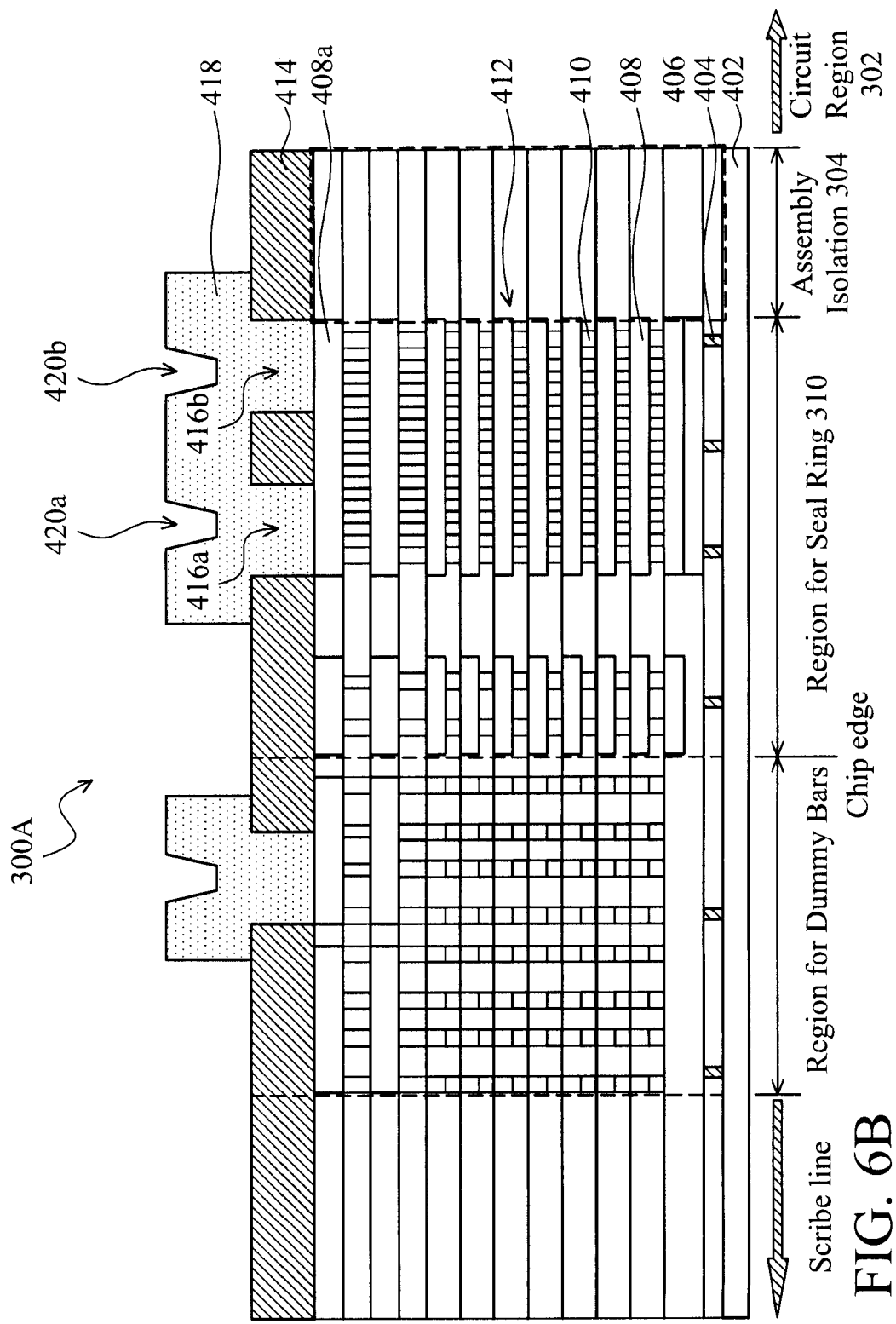

FIG. 6B illustrates the deposition and etch of a metal over the first passivation layer 414 and in the apertures 416a, 416b to form metal pad 418. The first passivation layer apertures 416a, 416b are adjacent to top metal layer 408a of seal ring structure 412, and the metal pad 418 is directly coupled to the top metal layer 408a. Metal pad 418 includes metal pad apertures 420a and 420b above first passivation layer apertures 416a and 416b, respectively. Metal pad apertures 420a, 420b may be formed by the deposition technique of the metal that forms metal pad 418 over the first passivation layer apertures or the metal pad apertures may be formed by patterning and etching techniques.

Figure 6C:
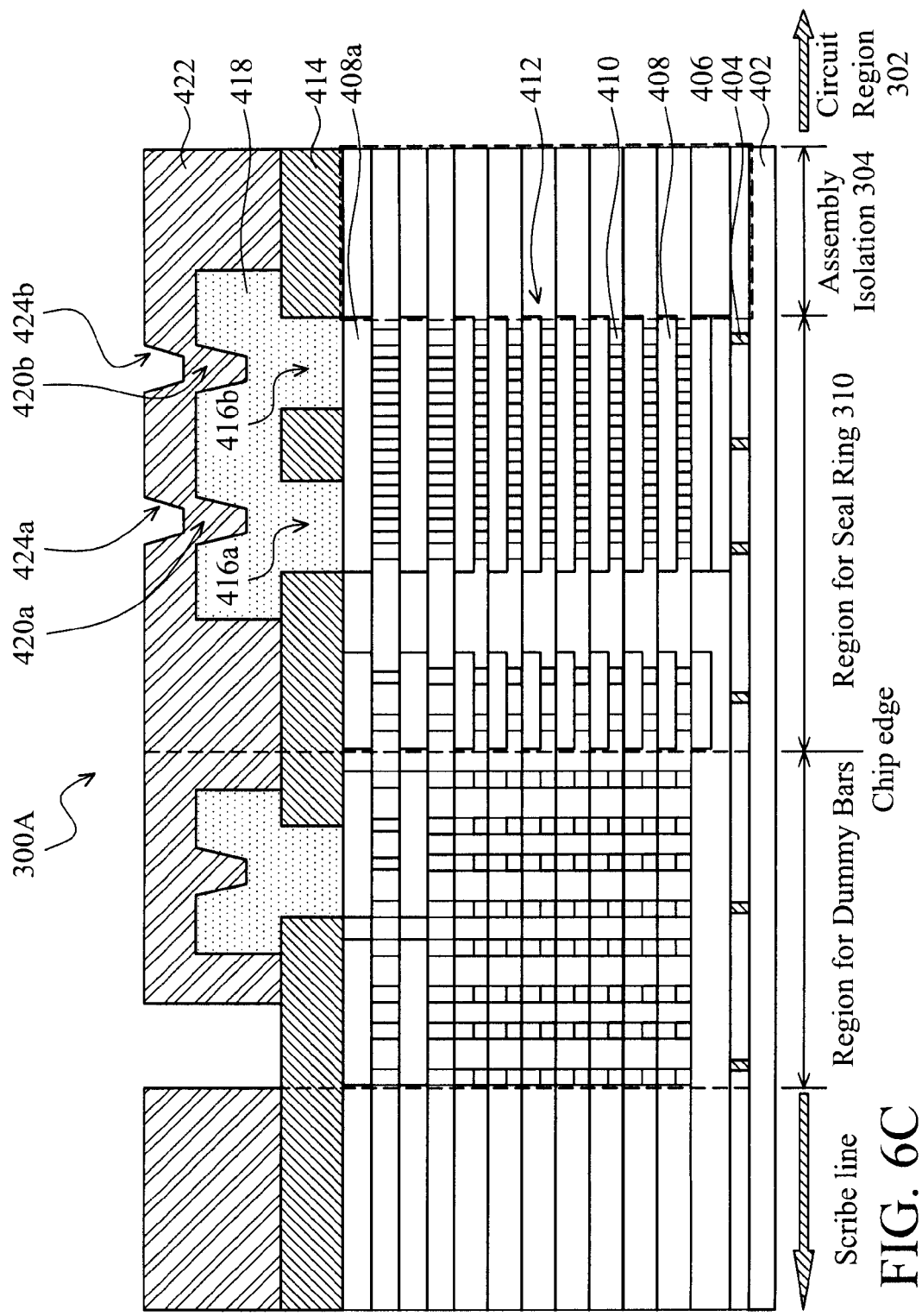

FIG. 6C illustrates the forming of second passivation layer 422 over first passivation layer 414 and metal pad 418. Second passivation layer apertures 424a and 424b are formed above metal pad apertures 420a and 430b and first passivation layer apertures 416a and 416b, respectively. In one example, the second passivation layer 422 includes a dielectric and is one of a silicon nitride or silicon oxide. In yet another example, the first passivation layer 414 is formed of silicon oxide or silicon nitride and the second passivation layer 422 is formed of silicon nitride or silicon oxide, respectively. In yet another example, the first passivation layer 414 and the second passivation layer 422 may be comprised of the same material. Second passivation layer 422 may be deposited by a high aspect ratio process (HARP) and/or a high density plasma (HDP) CVD process. Other applicable processes may be used. Apertures 424a and 424b may be formed by deposition of the passivation layer over the metal pad apertures or various applicable patterning and etching techniques may be used.

Figure 6D:
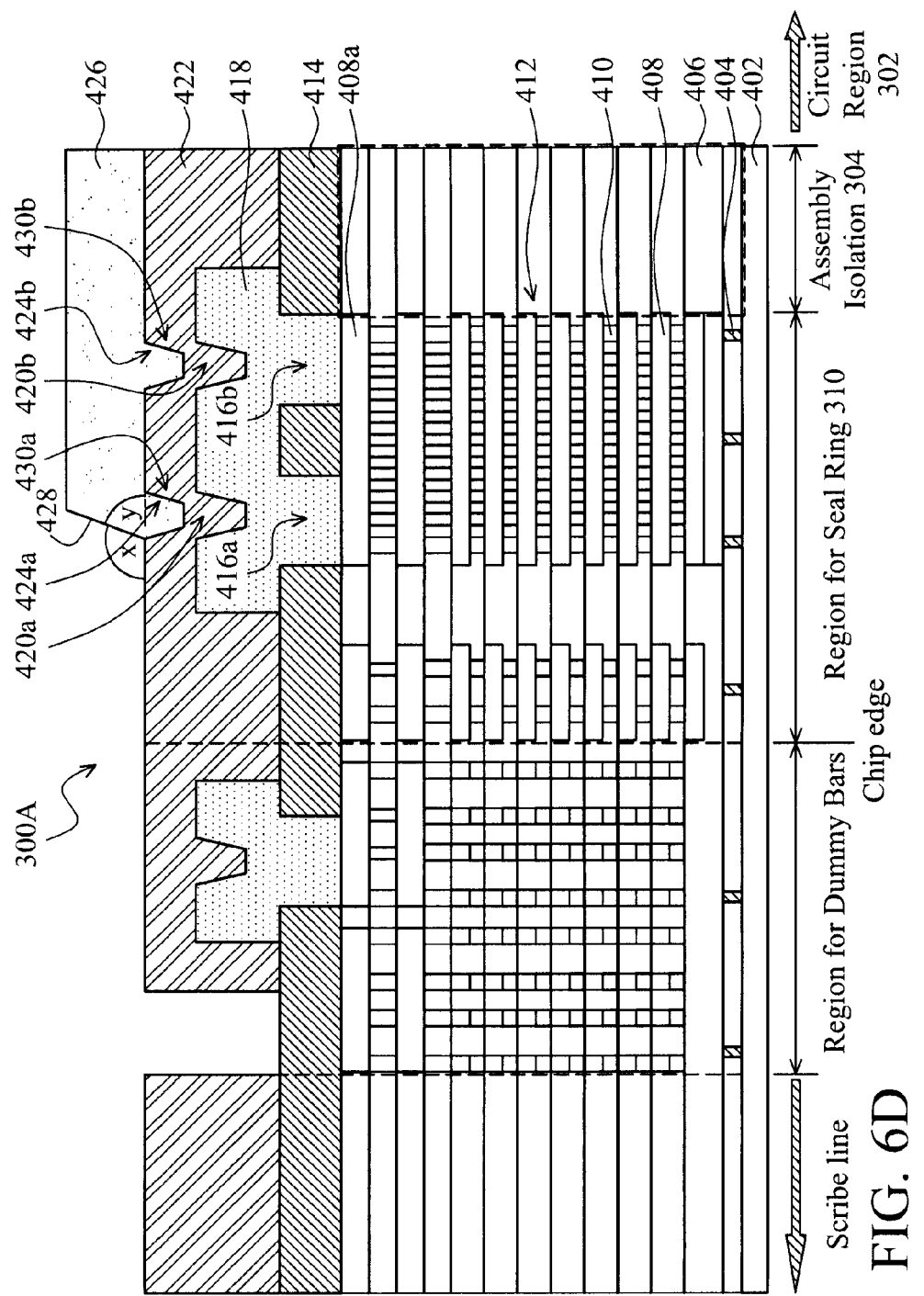

FIG. 6D illustrates the forming of polyimide layer 426 over the seal ring structure 412 and second passivation layer 422 filling the second passivation layer apertures 424a and 424b to form polyimide roots 430a and 430b. Polyimide layer 426 is formed to include exterior tapered edge 428 having, in one example, an angle from horizontal "y" between about 70 degrees and about 75 degrees and an angle from horizontal "x" between about 105 degrees and about 110 degrees. Polyimide root 430a is disposed at the exterior tapered edge 428 of the polyimide layer 426. Advantageously, polyimide shrink forces and/or peeling effects are reduced with greater vertical angle of the polyimide exterior edge. Polyimide layer 426 is formed to have a thickness from second passivation layer 422 ranging between about 5 micron and about 10 micron in one example. Advantageously, polyimide shrink forces and/or peeling effects are reduced with reduced thickness of the polyimide layer. Furthermore, forming a plurality of polyimide roots at the interface between polyimide layer 426 and second passivation layer 422 improves adhesion of the polyimide layer and reduces peeling effects. Polyimide layer 526 may be formed by various deposition techniques.

The various passivation layers, metal pads, and polyimide layer may undergo patterning and etch steps to form the structure profiles as desired. As note above, device 300A may undergo further processing to form various features such as contacts/vias, interconnect metal layers, interlayer dielectric, passivation layers, backside processing, etc. to form semiconductor circuits as is known in the art.

Referring now to FIGS. 7A-7D in conjunction with FIGS. 2 and 3, cross-sectional views are illustrated of the semiconductor device 300B of FIG. 5 at various stages of fabrication according to embodiments of the present disclosure.

Figure 7A:
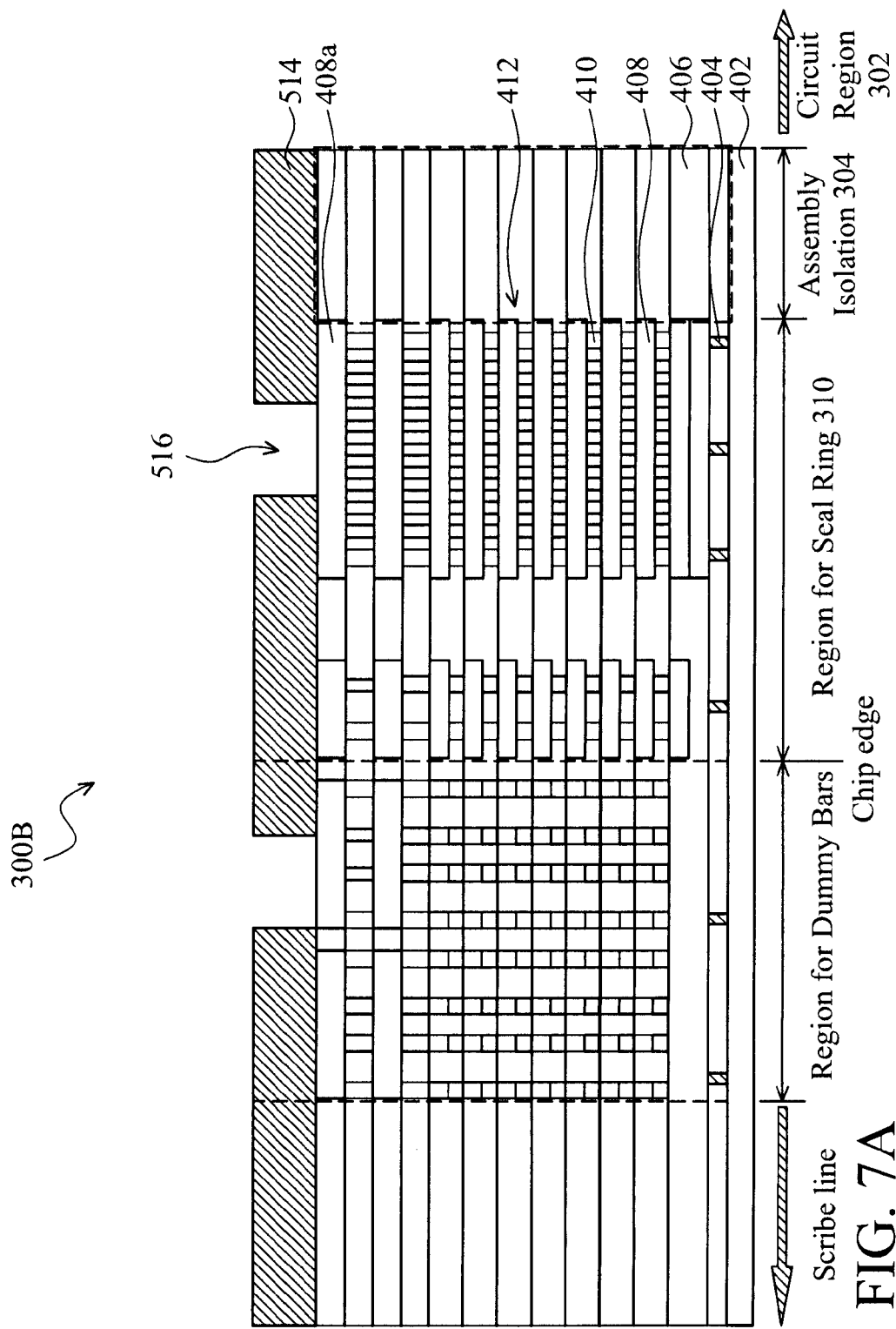
FIGS. 7A-7D are cross-sectional views of the semiconductor device of FIG. 5 at various stages of fabrication according to another embodiment of the present disclosure.

FIG. 7A illustrates the formation of semiconductor substrate 402 having a seal ring region 310 and assembly isolation region 304 surrounding IC die 302 in a circuit region. In an embodiment, the seal ring region 310 is formed around the circuit region, and the seal ring region is for forming a seal ring structure thereon and the circuit region is for forming at least a transistor device therein. Seal ring structure 412 is formed over substrate 402 in the seal ring region 310. Seal ring structure 412 may be comprised of various stacked conductive layers 408 and via layers 410 disposed through dielectric layers 406, and may have a width between about 5 microns and about 15 microns in one example. Seal ring structure 412 is further formed to include an exterior portion or side adjacent the chip edge and scribe line and an interior portion or side adjacent the assembly isolation 304 and the circuit region.

First passivation layer 514 is formed over the seal ring structure 412, in one example being deposited by a high aspect ratio process (HARP) and/or a high density plasma (HDP) CVD process. Other applicable deposition techniques may be used. In one example, the first passivation layer 514 includes a dielectric and is one of a silicon oxide or silicon nitride. First passivation layer aperture 516 is formed over the seal ring structure 412, and in this embodiment, first passivation layer aperture 516 is centrally formed over seal ring structure 412. Conventional patterning and etch techniques may be used to form first passivation layer aperture 516.

Figure 7B:
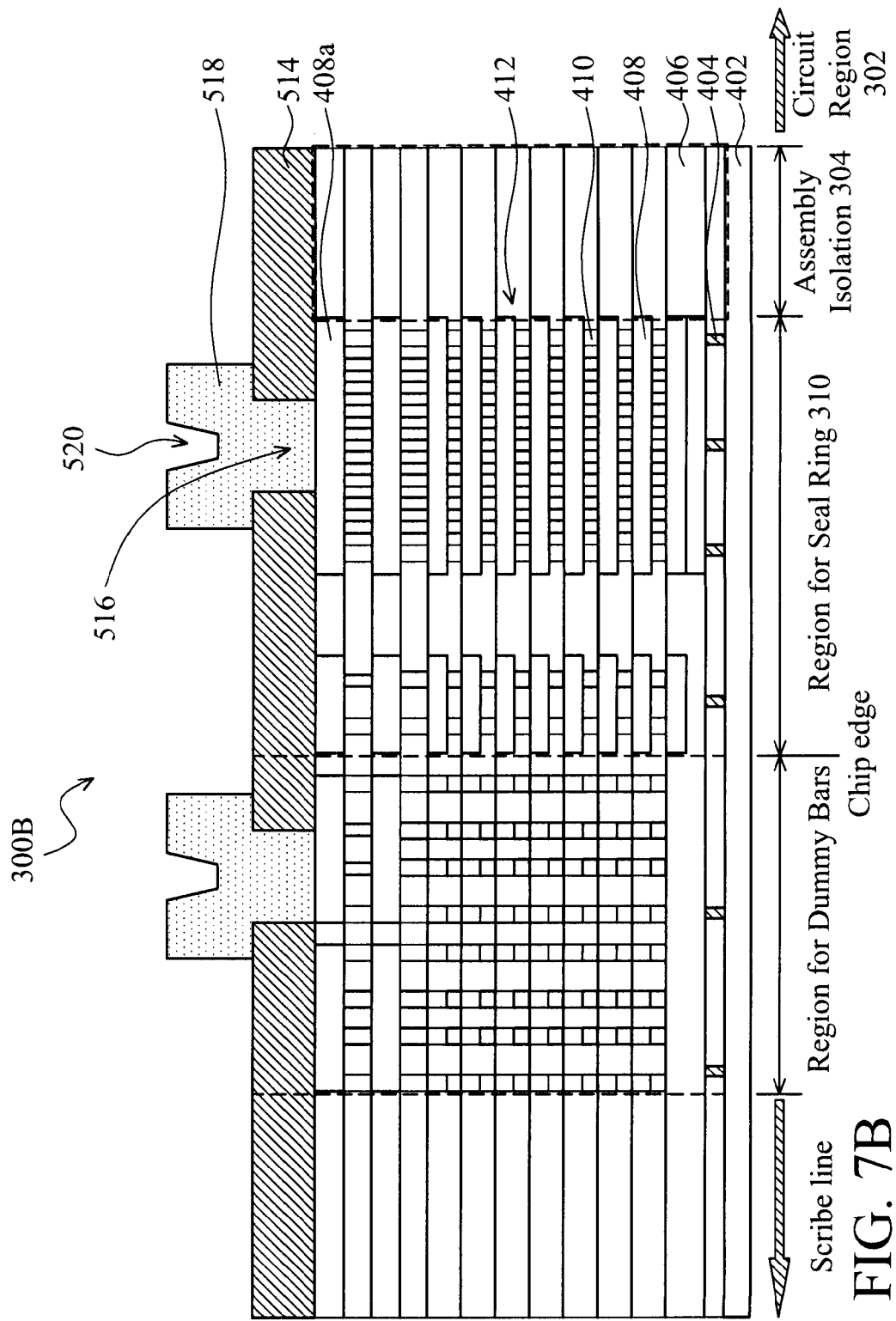

FIG. 7B illustrates the formation of metal pad 518 over the first passivation layer 514 filling the first passivation layer aperture 516 to couple metal pad 518 to seal ring structure 412. In one example, the metal pad 518 is coupled to a top metal layer 408a of seal ring structure 412. In one example, metal pad 518 may be comprised of aluminum and the metal layers of the seal ring structure may be comprised of copper. Other metals may be applicable. Metal pad aperture 520 is formed above first passivation layer aperture 516 by the deposition technique over first passivation layer aperture 515 or by known patterning and etching techniques.

Figure 7C:
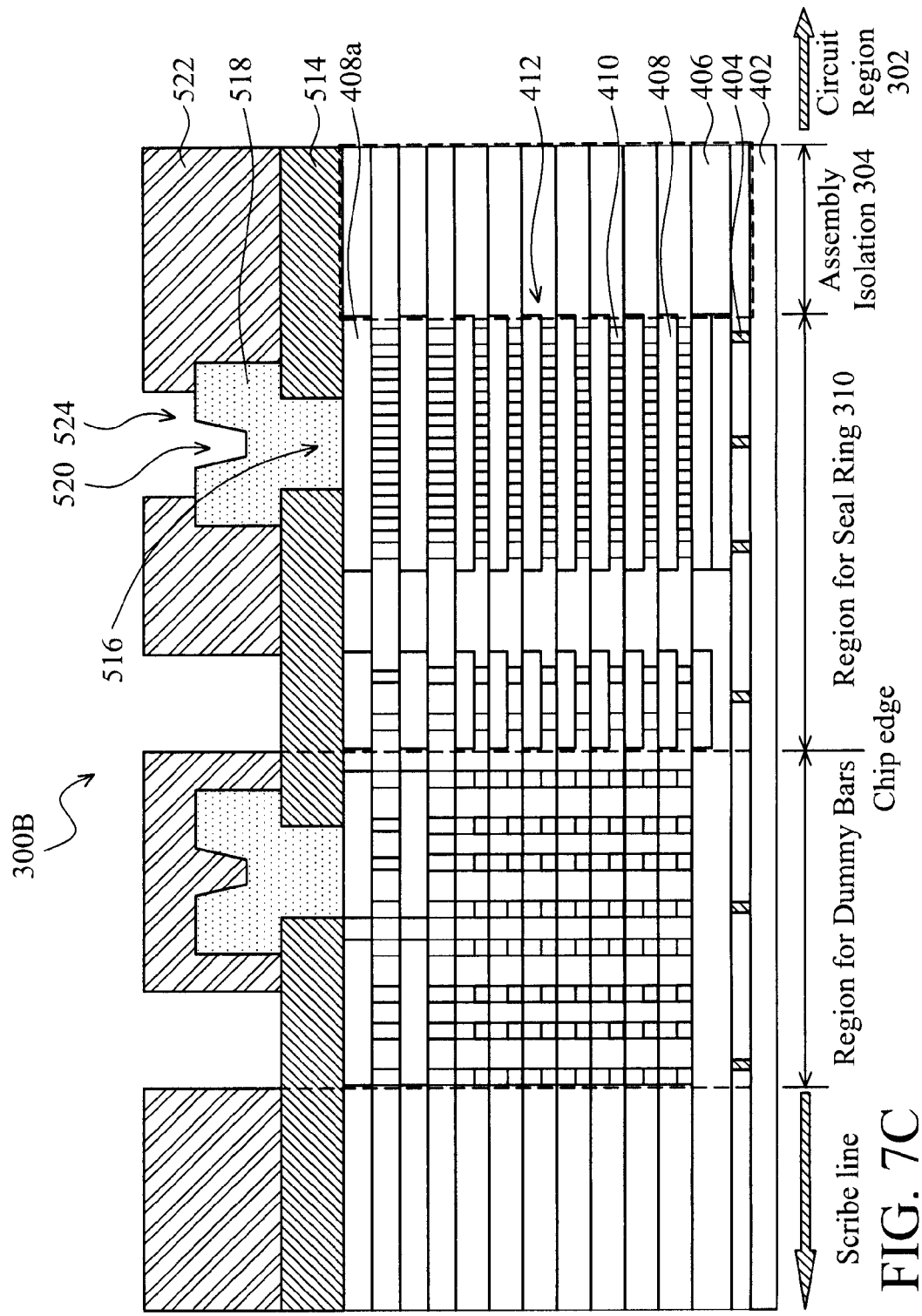

FIG. 7C illustrates the forming of second passivation layer 522 over seal ring structure 412, first passivation layer 514, and metal pad 518. Second passivation layer aperture 524 is formed above metal pad aperture 520 and first passivation layer aperture 516. In this embodiment, second passivation layer aperture 524 is formed to expose the metal pad and metal pad aperture 520. In one example, the second passivation layer 522 includes a dielectric and is one of a silicon nitride or silicon oxide. In yet another example, the first passivation layer 514 is formed of silicon oxide or silicon nitride and the second passivation layer 522 is formed of silicon nitride or silicon oxide, respectively. In yet another example, the first passivation layer 514 and the second passivation layer 522 may be comprised of the same material. Second passivation layer 522 may be deposited by a high aspect ratio process (HARP) and/or a high density plasma (HDP) CVD process in one example. Other applicable deposition techniques may be used. Conventional patterning and etch techniques may be used to form second passivation layer aperture 524.

Figure 7D:
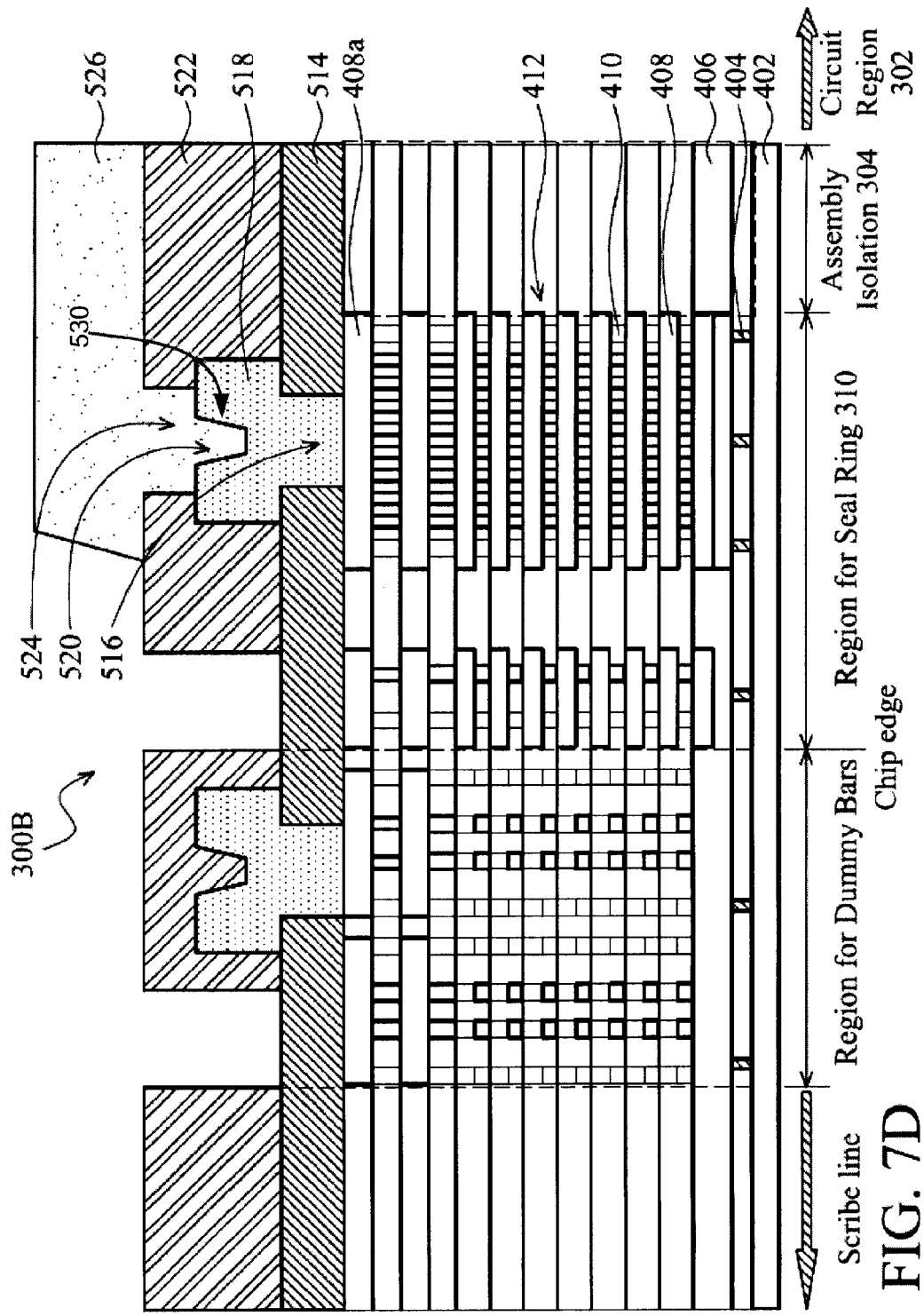

FIG. 7D illustrates the forming of polyimide layer 526 over the seal ring structure 412 and second passivation layer 522 filling the second passivation layer aperture 524 and metal pad aperture 520 to form polyimide root 530 that contacts the metal pad 518. Advantageously, such a polyimide root that contacts the metal pad improves adhesion of the polyimide layer to the second passivation layer and reduces peeling effects.

The various passivation layers, metal pads, and polyimide layer may undergo patterning and etch steps to form the structure profiles as desired. As note above, device 300B may undergo further processing to form various features such as contacts/vias, interconnect metal layers, interlayer dielectric, passivation layers, backside processing, etc. to form semiconductor circuits as is known in the art.

The present disclosure provides for many different embodiments and the methods, techniques, and structures of the present disclosure may be used in a CMOS image sensor (CIS) backside illuminated (BSI) product, and products which need wafer bonding processes such as in microelectromechanical systems (MEMS) products. Furthermore, semiconductor devices may be formed having a frontside metal pad coupled to a seal ring structure, a backside metal pad coupled to a seal ring structure, or both metal pads coupled to a seal ring structure.

One of the broader forms of the present disclosure involves a semiconductor device. The semiconductor device includes a substrate having a seal ring region and a circuit region, a seal ring structure disposed over the seal ring region, a first passivation layer disposed over the seal ring structure, the first passivation layer having a first passivation layer aperture over the seal ring structure, and a metal pad disposed over the first passivation layer, the metal pad coupled to the seal ring structure through the first passivation layer aperture and having a metal pad aperture above the first passivation layer aperture. The device further includes a second passivation layer disposed over the metal pad, the second passivation layer having a second passivation layer aperture above the metal pad aperture, and a polyimide layer disposed over the second passivation layer, the polyimide layer filling the second passivation layer aperture to form a polyimide root at an exterior tapered edge of the polyimide layer.

Another of the broader forms of the present disclosure involves a semiconductor device including a substrate having a seal ring region and a circuit region, a seal ring structure disposed over the seal ring region, a first passivation layer disposed over the seal ring structure, the first passivation layer having a first passivation layer aperture over the seal ring structure, and a metal pad disposed over the first passivation layer, the metal pad coupled to the seal ring structure through the first passivation layer aperture and having a metal pad aperture above the first passivation layer aperture. The device further includes a second passivation layer disposed over the metal pad, the second passivation layer having a second passivation layer aperture exposing the metal pad aperture, and a polyimide layer disposed over the second passivation layer, the polyimide layer filling the second passivation layer aperture to form a polyimide root contacting the metal pad.

Another of the broader forms of the present disclosure involves a method of fabricating a semiconductor device. The method includes providing a substrate having a seal ring region and a circuit region, forming a seal ring structure over the seal ring region, forming a first passivation layer over the seal ring structure, and forming in the first passivation layer a first passivation layer aperture over the seal ring structure. The method further includes forming a metal pad over the first passivation layer aperture to couple the metal pad to the seal ring structure exposed through the first passivation layer aperture, forming in the metal pad a metal pad aperture above the first passivation layer aperture, forming a second passivation layer over the metal pad, forming in the second passivation layer a second passivation layer aperture over the metal pad aperture, and forming a polyimide layer over the second passivation layer, the polyimide layer filling the second passivation layer aperture to form a polyimide root at an exterior tapered edge of the polyimide layer.

Another of the broader forms of the present disclosure involves a method of fabricating a semiconductor device. The method includes providing a substrate having a seal ring region and a circuit region, forming a seal ring structure over the seal ring region, forming a first passivation layer over the seal ring structure, and forming in the first passivation layer a first passivation layer aperture over the seal ring structure. The method further includes forming a metal pad over the first passivation layer aperture to couple the metal pad to the seal ring structure exposed through the first passivation layer aperture, forming in the metal pad a metal pad aperture above the first passivation layer aperture, forming a second passivation layer over the metal pad, forming in the second passivation layer a second passivation layer aperture exposing the metal pad aperture, and forming a polyimide layer over the second passivation layer, the polyimide layer filling the second passivation layer aperture and the metal pad aperture to form a polyimide root contacting the metal pad.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor device, comprising:
   a substrate having a seal ring region and a circuit region;
   a seal ring structure disposed over the seal ring region;
   a first passivation layer disposed over the seal ring structure, the first passivation layer having a first passivation layer aperture over the seal ring structure;
   a metal pad disposed over the first passivation layer, the metal pad coupled to the seal ring structure through the first passivation layer aperture and having a metal pad aperture above the first passivation layer aperture;
   a second passivation layer disposed over the metal pad, the second passivation layer having a second passivation layer aperture above the metal pad aperture; and
   a polyimide layer disposed over the second passivation layer, the polyimide layer filling the second passivation layer aperture to form a polyimide root at an exterior tapered edge of the polyimide layer, wherein the exterior tapered edge is adjacent the second passivation layer aperture.

2. The semiconductor device of claim 1, wherein the seal ring structure is comprised of a stack of metal layers disposed around the circuit region.

3. The semiconductor device of claim 1, wherein the metal pad contacts a top metal layer of the seal ring structure exposed through the first passivation layer aperture.

4. The semiconductor device of claim 1, wherein the first passivation layer is formed of silicon oxide or silicon nitride and the second passivation layer is formed of silicon nitride or silicon oxide, respectively.

5. The semiconductor device of claim 1, wherein the first passivation layer and the second passivation layer are comprised of the same material.

6. The semiconductor device of claim 1, wherein the polyimide layer has a thickness between about 5 μm and about 10 μm.

7. The semiconductor device of claim 1, wherein the exterior tapered edge of the polyimide layer has an angle from horizontal between about 70 degrees and about 75 degrees.

8. The semiconductor device of claim 1, further comprising:
a plurality of first passivation layer apertures over the seal ring structure;
a plurality of metal pad apertures above the plurality of first passivation layer apertures;
a plurality of second passivation layer apertures above the plurality of metal pad apertures; and
a plurality of polyimide roots disposed above the plurality of metal pad apertures.

9. A semiconductor device, comprising:
a substrate having a seal ring region and a circuit region;
a seal ring structure disposed over the seal ring region;
a first passivation layer disposed over the seal ring structure, the first passivation layer having a first passivation layer aperture over the seal ring structure;
a metal pad disposed over the first passivation layer, the metal pad coupled to the seal ring structure through the first passivation layer aperture and having a metal pad aperture above the first passivation layer aperture;
a second passivation layer disposed over the metal pad, the second passivation layer having a second passivation layer aperture exposing the metal pad aperture; and
a polyimide layer disposed over the second passivation layer, the polyimide layer filling the second passivation layer aperture to form a polyimide root contacting the metal pad and the polyimide layer having an exterior tapered edge, wherein the exterior tapered edge is tapered at an angle moving vertically toward the circuit region.

10. The semiconductor device of claim 9, wherein the seal ring structure is comprised of a stack of metal layers disposed around the circuit region.

11. The semiconductor device of claim 9, wherein the metal pad contacts a top metal layer of the seal ring structure exposed through the first passivation layer aperture.

12. The semiconductor device of claim 9, wherein the first passivation layer is formed of silicon oxide or silicon nitride and the second passivation layer is formed of silicon nitride or silicon oxide, respectively.

13. The semiconductor device of claim 9, wherein the first passivation layer and the second passivation layer are comprised of the same material.

14. A method of fabricating a semiconductor device, the method comprising:
providing a substrate having a seal ring region and a circuit region;
forming a seal ring structure over the seal ring region;
forming a first passivation layer over the seal ring structure;
forming in the first passivation layer a first passivation layer aperture over the seal ring structure;
forming a metal pad over the first passivation layer aperture to couple the metal pad to the seal ring structure exposed through the first passivation layer aperture;
forming in the metal pad a metal pad aperture above the first passivation layer aperture;
forming a second passivation layer over the metal pad;
forming in the second passivation layer a second passivation layer aperture over the metal pad aperture; and
forming a polyimide layer over the second passivation layer, the polyimide layer filling the second passivation layer aperture to form a polyimide root at an exterior tapered edge of the polyimide layer, wherein the exterior tapered edge is adjacent the second passivation layer aperture.

15. The method of claim 14, wherein the polyimide layer is formed to have a thickness between about 5 μm and about 10 μm.

16. The method of claim 14, wherein polyimide layer is formed to have the exterior tapered edge of the polyimide layer at an angle from horizontal between about 70 degrees and about 75 degrees.

17. The method of claim 14, further comprising:
forming a plurality of first passivation layer apertures over the seal ring structure;
forming a plurality of metal pad apertures above the plurality of first passivation layer apertures;
forming a plurality of second passivation layer apertures above the plurality of metal pad apertures; and
forming a plurality of polyimide roots disposed above the plurality of metal pad apertures.

18. A method of fabricating a semiconductor device, the method comprising:
providing a substrate having a seal ring region and a circuit region;
forming a seal ring structure over the seal ring region;
forming a first passivation layer over the seal ring structure;
forming in the first passivation layer a first passivation layer aperture over the seal ring structure;
forming a metal pad over the first passivation layer aperture to couple the metal pad to the seal ring structure exposed through the first passivation layer aperture;
forming in the metal pad a metal pad aperture above the first passivation layer aperture;
forming a second passivation layer over the metal pad;
forming in the second passivation layer a second passivation layer aperture exposing the metal pad aperture; and
forming a polyimide layer over the second passivation layer, the polyimide layer filling the second passivation layer aperture and the metal pad aperture to form a polyimide root contacting the metal pad and the polyimide layer having an exterior tapered edge, wherein the exterior tapered edge is tapered at an angle moving vertically toward the circuit region.

19. The method of claim 18, wherein the metal pad contacts a top metal layer of the seal ring structure exposed through the first passivation layer aperture.

20. The method of claim 18, wherein the first passivation layer is formed of silicon oxide or silicon nitride and the second passivation layer is formed of silicon nitride or silicon oxide, respectively.

* * * * *